US009979066B2

(12) United States Patent
Natsuhara et al.

(10) Patent No.: US 9,979,066 B2
(45) Date of Patent: May 22, 2018

(54) FEED LINE COMPRISED OF A TRIPLATE LINE COUPLED BETWEEN A WAVEGUIDE/TRIPLATE LINE CONVERTER AND PATCH ANTENNAS FOR OPTIMIZING SIGNALS THROUGH THE FEED LINE

(71) Applicant: Japan Radio Co., Ltd., Tokyo (JP)

(72) Inventors: Keiichi Natsuhara, Tokyo (JP); Katsuyoshi Ishida, Tokyo (JP); Kazuaki Yoshida, Tokyo (JP); Kiyomi Okawa, Tokyo (JP); Hiroshi Itoh, Tokyo (JP); Takeshi Oga, Tokyo (JP); Kazufumi Igarashi, Tokyo (JP)

(73) Assignee: JAPAN RADIO CO., LTD., Tokyo (JP)

( * ) Notice: Subject to any disclaimer, the term of this patent is extended or adjusted under 35 U.S.C. 154(b) by 0 days. days.

(21) Appl. No.: 14/898,744

(22) PCT Filed: May 20, 2014

(86) PCT No.: PCT/JP2014/063366
§ 371 (c)(1),
(2) Date: Dec. 15, 2015

(87) PCT Pub. No.: WO2014/203672
PCT Pub. Date: Dec. 24, 2014

(65) Prior Publication Data
US 2016/0141741 A1    May 19, 2016

(30) Foreign Application Priority Data

Jun. 18, 2013    (JP) .................................. 2013-127068

(51) Int. Cl.
*H01P 5/107*    (2006.01)
*H01P 5/12*    (2006.01)
(Continued)

(52) U.S. Cl.
CPC ................. *H01P 5/107* (2013.01); *H01P 5/12* (2013.01); *H01Q 21/065* (2013.01); *H03H 7/38* (2013.01)

(58) Field of Classification Search
CPC ........ H01P 5/107; H01P 5/12; H01Q 21/0037; H01Q 21/065
(Continued)

(56) References Cited

U.S. PATENT DOCUMENTS 5,258,727 A * 11/1993 DuPuis et al. .......... H01P 5/107
                                                333/26
5,394,119 A    2/1995 Pleva et al.
(Continued)

FOREIGN PATENT DOCUMENTS

| CL | 199600974 | 3/1997 |
| CL | 199900308 | 11/1999 |

(Continued)

OTHER PUBLICATIONS

Search Report dated Jan. 20, 2017 of the European Patent Application No. 14813084.2.
(Continued)

*Primary Examiner* — Benny Lee
(74) *Attorney, Agent, or Firm* — Nixon Peabody LLP; Jeffrey L. Costellia

(57) ABSTRACT

A feed line in the form of a trip late line that runs from a waveguide/triplate-line converter coupled to a radio to a plurality of patch antennas in a cluster pattern. The width and length of a section of said feed line between the waveguide/triplate-line converter and the branch point nearest thereto are set such that the impedance of said section directly matches the parallel combination of the impedances of branches beyond said branch point and the loss in said section is kept to or below a predetermined upper limit.

2 Claims, 6 Drawing Sheets

(51) Int. Cl.
*H01Q 21/06* (2006.01)
*H03H 7/38* (2006.01)

(58) Field of Classification Search
USPC .................................. 333/26, 33, 125, 137
See application file for complete search history.

(56) References Cited

U.S. PATENT DOCUMENTS

| | | | |
|---|---|---|---|
| 5,539,361 A * | 7/1996 | Davidovitz | H01P 5/107 333/26 |
| 6,317,094 B1 | 11/2001 | Wu et al. | |
| 2009/0309804 A1 | 12/2009 | Chen et al. | |

FOREIGN PATENT DOCUMENTS

| | | |
|---|---|---|
| CL | 199900329 | 9/2000 |
| EP | 0424108 A2 | 4/1991 |
| JP | 61-239701 A | 10/1986 |
| JP | 07-052803 B | 6/1995 |
| JP | 2002-368507 A | 12/2002 |
| JP | 2005-094314 A | 4/2005 |
| JP | 2006-279474 A | 10/2006 |

OTHER PUBLICATIONS

PCT/JP2014/063366 International Application No., International Search Report dated Jul. 22, 2014.
Chilean Office Action (Application No. 2015003613) dated Jul. 27, 2017.

* cited by examiner

őt # FEED LINE COMPRISED OF A TRIPLATE LINE COUPLED BETWEEN A WAVEGUIDE/TRIPLATE LINE CONVERTER AND PATCH ANTENNAS FOR OPTIMIZING SIGNALS THROUGH THE FEED LINE

CROSS-REFERENCE TO RELATED PATENT APPLICATION

The present application is a National Stage Application of International Application No. PCT/JP2014/063366 entitled "FEED LINE" filed May 20, 2014, which claims priority to Japanese Patent Application Number 2013-127068 filed Jun. 18, 2013, the contents of which are incorporated herein by reference in their entirety.

BACKGROUND OF THE INVENTION

Field of the Invention

The present invention relates to a feed line formed as a triplate line that runs from a waveguide/triplate-line converter coupled to a radio to a plurality of patch antennas in a cluster pattern.

Description of the Related Art

In satellite communication systems and fixed wireless access (FWA) systems in which wireless transmission is performed in microwave bands and millimeter wave bands over a 10 GHz band, a planar antenna made up of many patch antennas is often employed, and a feed line for these patch antennas is formed as a triplate line in which a structure thereof is simple, parallel feeding can be precisely realized at low cost, and furthermore, gain and efficiency can be highly secured.

As illustrated in FIG. 4, a conventional triplate feed-type planar antenna is made up of, for example, a ground plane 41, a foam sheet 42-1, a flexible substrate 43, a foam sheet 42-2, and a slot plate 44 that are laminated together.

Also, the elements laminated in this way are constituted as follows.

(1) The ground plane 41 is formed with a pattern corresponding to a plane ground on an upper surface thereof.

(2) The foam sheets 42-1 and 42-2 are constituted as cushion material, an insulator, and a dielectric that sandwich the flexible substrate 43 from opposite surfaces thereof.

(3) Along with an array of rectangular patch antennas $43A_{1,1}$ to $43A_{m,n}$ (where m and n are integers) arranged in a lattice pattern, a feed line 43F implementing parallel feeding for these patch antennas is formed at the flexible substrate 43 as a circuit pattern.

(4) Lattice-patterned slot openings $44S_{1,1}$ to $44S_{m,n}$ are formed in a top surface of the slot plate 44 at regions individually corresponding to the patch antennas, and a plane ground pattern is formed on an overall surface other than these regions.

For example, as illustrated in FIG. 5, a feed system of this triplate feed-type planar antenna is constituted as follows.

A waveguide/triplate-line converter (hereinafter referred to simply as "converter") 43C is disposed at a predetermined region surrounded by the patch antennas $43A_{1,1}$ to 43Am,n on the flexible substrate 43.

Furthermore, a main line 43B is formed on the flexible substrate 43. In the main line 43B, one end thereof continues to a probe 43CP inserted from a sidewall into a pipe of a waveguide $43C_{WC}$ constituting the converter 43C, the other end thereof continues to a bus bar 43FM of a feed line 43F implementing the aforementioned parallel feeding, and a width thereof is identical to that of the bus bar 43FM.

Also, a transformer 43T, a width of which is set to be narrower than that of the bus bar 43FM, is formed as a circuit pattern in the vicinity of a connection point with the main line 43B on the bus bar 43FM.

As illustrated in FIG. 6, among the constituent elements of the converter 43C, the waveguide $43C_{WC}$ paired with the aforementioned probe 43CP, as shown in FIG. 5, is made up of the following elements.

(1) A waveguide flange 43CF that corresponds to (is coupled to) one end of a rectangular waveguide connected to a radio (not illustrated) has a rectangular opening continuing into a pipe of the rectangular waveguide, and is disposed in a state in which the opening is in contact with a region corresponding to the ground plane 41.

(2) An annular member 43CR that is formed at the foam sheet 42-1, the flexible substrate 43, and the foam sheet 42-2, which are laminated together, is inserted into a through-hole equivalent to a virtual extension part of the opening, and is formed as a dielectric cylinder having a through-hole through which the aforementioned probe 43CP (FIG. 5) passes.

(3) An annular member 43Cr that is stacked on the annular member 43CR via the slot plate 44 and causes the inside of the pipe of the waveguide flange 43CF to extend to the outside of the slot plate 44 along with the annular member 43CR.

(4) A short circuit plate 43Cs which is installed across a top including an opening of the annular member 43Cr, and in which holes, through which screws 43S-1 to 43S-5 to be described below pass, are formed in the top.

(5) The screws 43S-1 to 43S-5 that are inserted into screw holes formed in the waveguide flange 43CF in correspondence with these holes, and thereby clamp the ground plane 41, the annular member 43CR, the slot plate 44, and the annular member 43Cr between the waveguide flange 43CF and the short circuit plate 43Cs.

The ground plane 41, the annular member 43CR, the slot plate 44, and the annular member 43Cr are previously formed with holes (not illustrated) into which the screws 43S-1 to 43S-5 are inserted and have inner walls of dimensions and shapes to stably come in contact with sidewalls of these screws 43S-1 to 43S-5.

In the triplate feed-type planar antenna having this constitution, the waveguide $43C_{WC}$ (FIG. 5) is sandwiched between the aforementioned waveguide flange 43CF and the short circuit plate 43Cs by the screws 43S-1 to 43S-5, and is defined by inner walls of the ground plane 41, the annular member 43CR, the slot plate 44, and the annular member 43Cr that are electrically connected by these screws 43S-1 to 43S-5.

Furthermore, in FIG. 5, the probe 43CP converts a transmission wave, which is output by a transmitter (not illustrated) and is forwarded as a basic mode of an electromagnetic field propagated in the pipe of the waveguide $43C_{WC}$ into an "electromagnetic field of the triplate line."

On the flexible substrate 43, the "electromagnetic field of the triplate line" is forwarded to the bus bar 43FM via the aforementioned main line 43B and the transformer 43T, and is subjected to the parallel feeding to the patch antennas $43A_{1,1}$ to 43Am,n.

In this feeding process, as the width of the transformer 43T is set to be narrower than the width of the bus bar 43FM, the transformer 43T performs impedance matching between the bus bar 43FM and the main line 43B, the widths of which are equally formed.

Therefore, the parallel feeding to the patch antennas 43A$_{1,1}$ to 43Am,n is inexpensively realized without damage to the triplate line, which makes high gain and efficiency possible.

The prior art related to the present invention includes Patent Literature 1 described below.

Patent Literature 1 discloses a planar antenna that has a constitution of a triplate in which strip lines formed in a board are sandwiched with a space of about 2 mm from opposite sides by ground boards, a radiation element is formed at one of the ground boards, and power is supplied to respective radiation elements by feed lines of the strip lines, and is characterized in that a stripline/waveguide converter is formed in which the strip lines have final feed points whose widths are about 1.7 mm and are inserted from both sides of a waveguide having a size of 19.05 mm×9.525 mm, an interval between the two strip lines is set to about 0.5 to 1.0 mm, and a phase difference between power input into the waveguide from both of the strip lines is set to 180°, thereby making it possible to supply power using a wavelength capable of achieving good power combining (branching) efficiency.

CITATION LIST

Patent Literature

Patent Literature 1
Japanese Examined Patent Application, Second Publication No. H07-52803

SUMMARY OF THE INVENTION

Technical Problem

Incidentally, in the aforementioned triplate feed-type planar antenna, if the transmission wave has power of about 50 watts, which is considerably greater than conventional power of 25 watts, a loss converted into heat by the main line 43B increases.

Furthermore, the main line 43B is sandwiched between the foam sheets 42-1 and 42-2 having heat insulating properties, and is also sandwiched again by the ground plane 41 and the slot plate 44, and hence is heated up to about 150° C.

Also, as mentioned above, the transformer 43T is narrow in width compared to the main line 43B and the bus bar 43FM, and hence is heated up to, for instance, about 115° C.

However, the foam sheets 42-1 and 42-2 have low heat-resistant temperatures of 90° C. to 130° C., and hence regions abutting the main line 43B and the transformer 43T are melted. In this state, characteristics such as characteristic impedance suitable for the triplate line are degraded, and hence transmission of a desired high-power transmission wave is impeded.

That is, in the conventional example, since a heat radiation characteristic of the triplate line constituting the feed line is fundamentally low, as transmission power is increased, the characteristic may be not secured or may be not stable, and overall performance and reliability may be remarkably lowered.

An object of the present invention is to provide a feed line capable of inexpensively adapting to large power without being accompanied by a change in basic constitution and an increase in physical size.

Solution to the Problem

According to a first aspect of the present invention, a feed line coupled to a radio is provided, which is formed as a triplate line that runs in a cluster pattern from a waveguide/triplate-line converter to a plurality of patch antennas, wherein a width and a length of a section of the feed line between the waveguide/triplate-line converter and a branch point on the feed line which is closest to the waveguide/triplate-line converter are set to values at which a loss of the section of the feed line is suppressed to or below a preset upper limit, and impedance of the section of the feed line directly matches impedance of the feed line downstream of the branch point in parallel.

That is, the width and the length of the section running from the waveguide/triplate-line converter to the branch point on the feed line are set to values at which impedance mismatching and a loss do not occur unnecessarily.

According to a second aspect of the present invention, in the feed line according to the first aspect, the width and the length may be set to values at which both or any one of a temperature and an amount of heat generated in the feed line is suppressed within a preset limit in an environment to which the feed line is exposed under power supplied via the waveguide/triplate-line converter.

That is, the width and the length of the section running from the waveguide/triplate-line converter to the branch point on the feed line are set to values at which a temperature and an amount of heat caused due to the impedance mismatching and the unnecessary loss are within a preset limit.

According to a third aspect of the present invention, in the feed line according to the first or second aspect, the feed line may be formed as the triplate line that realizes parallel feeding from the waveguide/triplate-line converter to the plurality of patch antennas.

That is, in the feed line according to the present invention, without being accompanied by a considerable disparity in a width of any path individually running from the waveguide/triplate-line converter to the plurality of patch antennas, a level and a phase of a radio signal whose power is supplied to these patch antennas may be precisely set to desired values.

Advantageous Effects of the Invention

As the feed line according to the present invention is formed as the triplate line, heating and degradation of characteristics caused by the heating are avoided even in the case in which heat radiation efficiency is structurally low and power supplied from the radio via the waveguide/triplate-line converter is large.

Also, in the feed line according to the present invention, as it is formed as the triplate line, a temperature and an amount of heat attributed to heating are suppressed within a limit within which no characteristics are degraded even in the case in which the heat radiation efficiency is structurally low and the power supplied from the radio via the waveguide/triplate-line converter is large.

Accordingly, in an antenna system to which the present invention is applied, supply of power to the individual patch antennas is simply realized with high precision in a desired mode, and furthermore, characteristics and reliability are kept high.

DETAILED DESCRIPTION OF THE EMBODIMENTS

Hereinafter, embodiments of the present invention will be described in detail based on the drawings.

Figure 1:
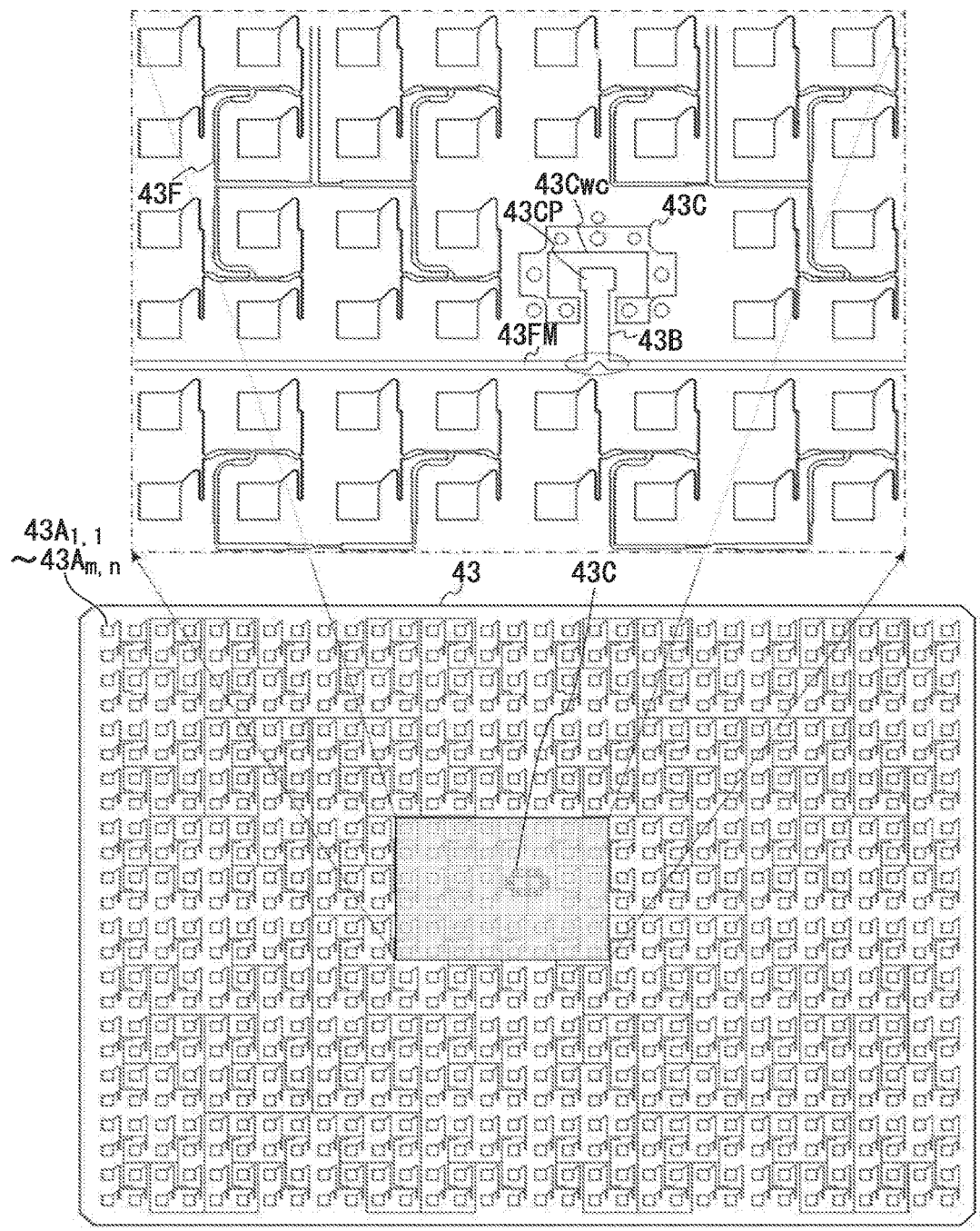
FIG. 1 is a view illustrating an embodiment of the present invention.

FIG. 1 is a view illustrating an embodiment of the present invention.

Figure 4:
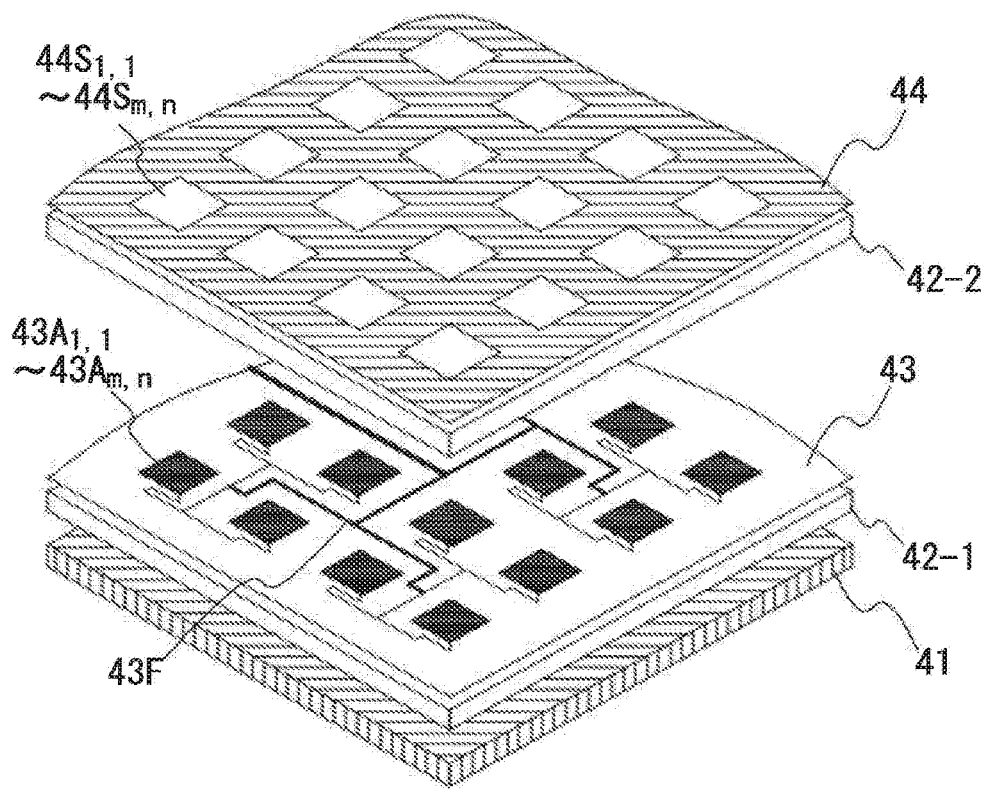
FIG. 4 is a view illustrating a constitution example of a conventional triplate feed-type planar antenna.
Figure 5:
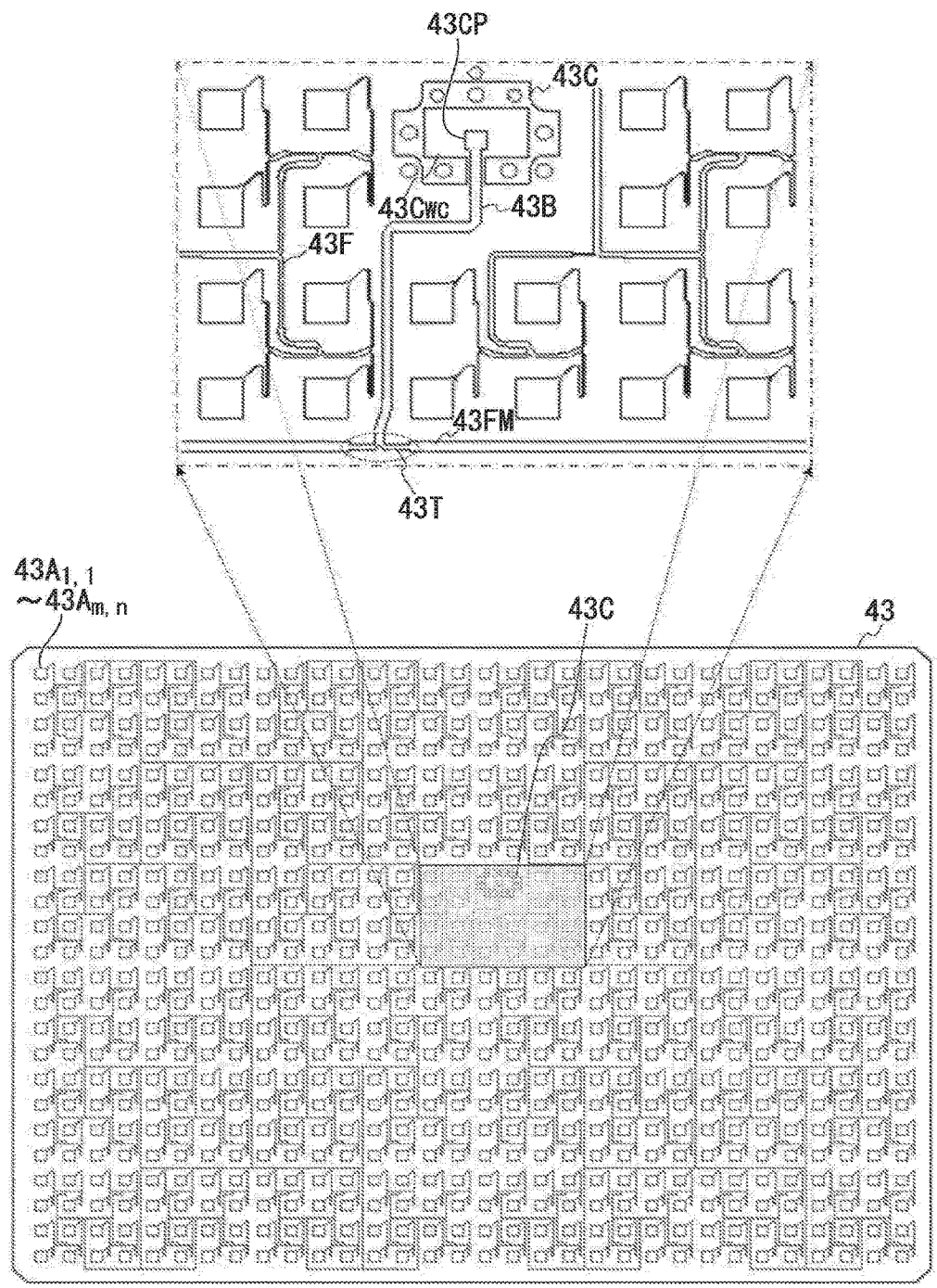
FIG. 5 is a view illustrating a constitution of a feeding system of a conventional triplate feed-type planar antenna.
Figure 6:
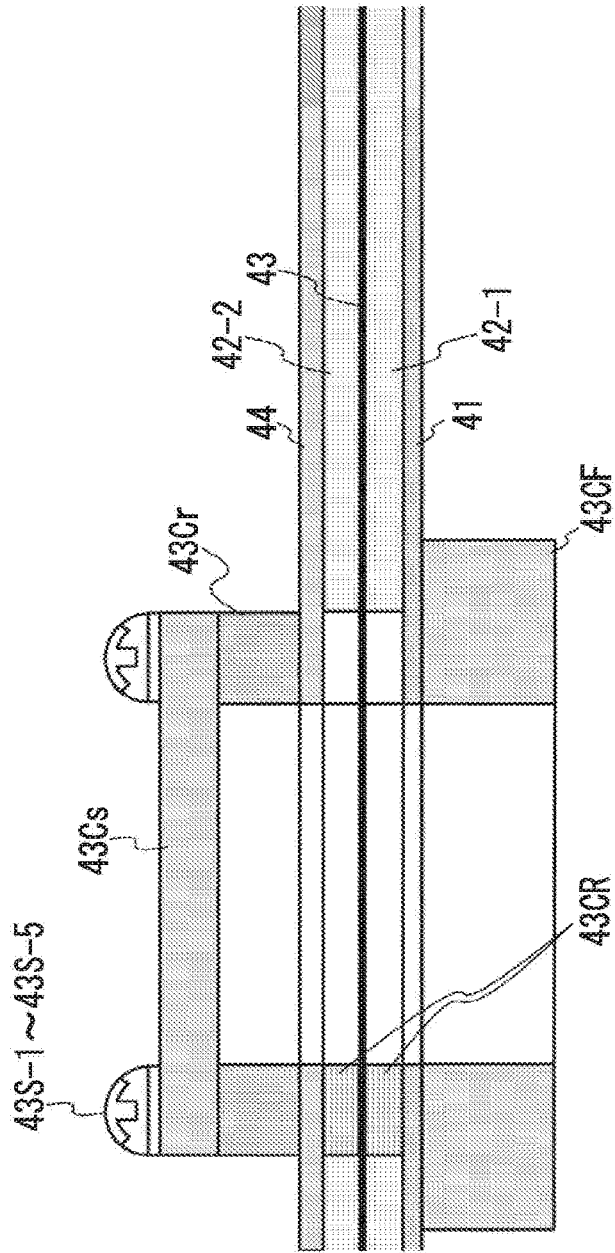
FIG. 6 is a sectional view of the conventional feeding system.

In FIG. 1, elements having the same function as those illustrated in FIGS. 4 and 5 are given the same symbols, and description thereof will be omitted here.

In the present embodiment, a constitution of a flexible substrate 43 differs from a conventional example illustrated in FIGS. 4 and 5 in the following respect.

(1) A converter 43C is disposed at a point close to a bus bar 43FM.

(2) Thus, a length of a main line 43B is set to be short.

(3) In addition, the main line 43B is set in width of about 2.5 times (impedance becomes one half times) in comparison with the main line width of the conventional example of FIG. 5.

(4) Also, the main line 43B is formed as a circuit pattern that directly continues to the bus bar 43FM. As indicated in FIG. 1 by a dotted line frame, a transformer 43T found in FIG. 5 is not formed at a connecting point between the main line 43B and the bus bar 43FM.

Hereinafter, an operation of the present embodiment will be described with reference to FIG. 1.

Similar to the conventional example, a probe 43CP converts a transmission wave, which is output by a transmitter and is handed over as a basic mode of an electromagnetic field propagated in a pipe of a waveguide $43C_{WC}$, into an "electromagnetic field of a triplate line."

Similar to the conventional example (FIG. 5), a probe 43CP converts a transmission wave, which is output by a transmitter and is handed over as a basic mode of an electromagnetic field propagated in a pipe of a waveguide $43C_{WC}$, into an "electromagnetic field of a triplate line."

On the flexible substrate 43, the "electromagnetic field of the triplate line" is forwarded to the bus bar 43FM via the aforementioned main line 43B.

The transmission wave output by the transmitter in this way is forwarded to the bus bar 43FM, and is subjected to parallel feeding to patch antennas $43A_{1,1}$ to $43Am,n$ in the same way as the conventional example.

Also, since the main line 43B is set in width of about 2.5 times (impedance becomes one half time) the main line width of the conventional example, an electric signal is forwarded to the bus bar 43FM without being accompanied by impedance mismatching caused by branching of the bus bar 43FM from the main line 43B in two directions even though the transformer 43T is not provided.

Furthermore, since the converter 43C is disposed at the point close to the bus bar 43FM, a length of the main line 43B is set to be considerably shorter than that of the conventional example.

That is, electric resistance of the main line 43B intervening between the probe 43CP and the bus bar 43FM is considerably reduced compared to the conventional example.

In this way, according to the present embodiment, although the transmission wave has power of about 50 watts, which is considerably greater than that of the conventional example, a percentage of the power converted into heat by the main line 43B has a considerably smaller value than the conventional example.

Figure 2:
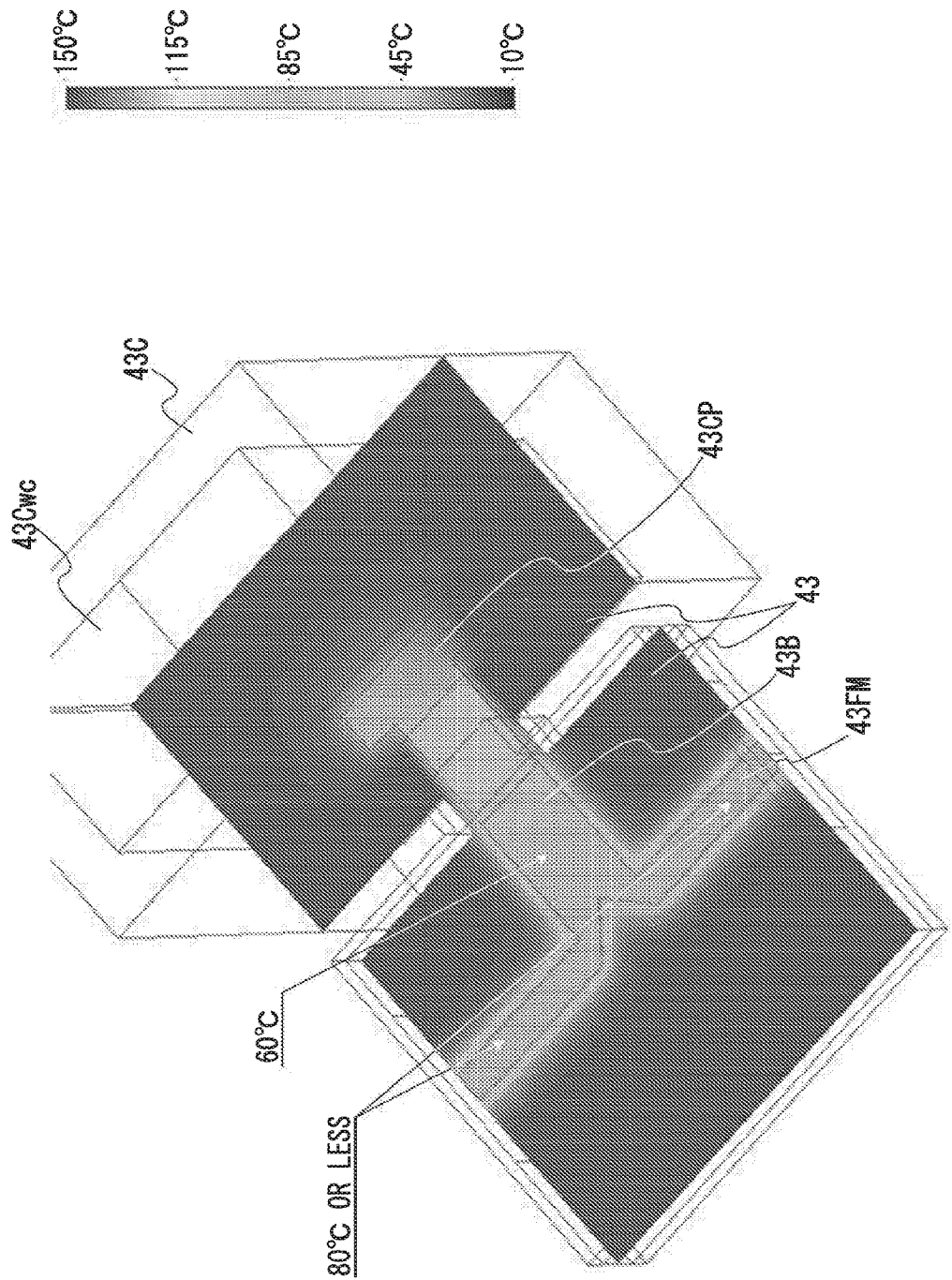
FIG. 2 is a view illustrating temperature distribution of a feeding system in the present embodiment.

Therefore, as illustrated in FIG. 2, a temperature of each part is suppressed to a smaller value than, for example, heat-resistant temperatures (90° C. to 130° C.) of foam sheets 42-1 and 42-2 (FIG. 1).

(1) A temperature of the main line 43B becomes about 60° C.

(2) Since there is no region whose width is narrow like the transformer 43T found in FIG. 5, there are no places that exceed the heat-resistance temperatures of the foam sheets 42-1 and 42-2.

(3) A temperature of the bus bar 43FM becomes 80° C. or less.

That is, none of the shapes, dimensions, and dispositions of the feed line and the patch antennas $43A_{1,1}$ to $43A_{m,n}$ (FIG. 1) is considerably changed, and an adjustment to large transmission power is made possible with a low heat radiation characteristic specific to the triplate line constituting the feed line. The waveguide/triplate-line converter 43C in FIG. 2 is configured by the waveguide 43Cwc and the probe 43Cp. The probe 43Cp is connected to the main line 43B. The temperature scale in FIG. 2 shows the relationship between color versus temperature when the temperature of each part in the vicinity of waveguide/triplate-line converter 43C is expressed in color. In FIG. 2, elements having the same function as those illustrated in FIGS. 1, 4 and 5 are given the same numerals, and description thereof will be omitted here.

Furthermore, since the length of the main line 43B is reduced, for instance, from 76 millimeters to 19 millimeters, a loss converted into heat is reduced, and thereby a total gain of the patch antennas $43A_{1,1}$ to $43Am,n$ is improved by about 0.1 dB.

Therefore, according to the present embodiment, even when the transmission power is large, or is widely changeable, characteristics and reliability of an antenna system are stably secured.

In the present embodiment, the foam sheets 42-1 and 42-2 are not limited to plate-like formed materials, and may be formed of any material as long as they function as a suitable dielectric at a desired frequency.

Also, in the present embodiment, a material of the flexible substrate 43 may be any material as long as a desired characteristic is obtained. For example, when a wavelength should be adjusted for a balance between a frequency and a physical size, the material of the flexible substrate 43 may be a ceramic in which values of effective Q and specific dielectric constant are preferable.

Furthermore, in the present embodiment, the bus bar 43FM branches off at the connecting point with the main line 43B in the two directions. However, if impedance matching is achieved between the main line 43B and the bus bar 43FM, and a heat value generated by the two is suppressed below a desired threshold value, the bus bar 43FM may branch off at the connecting point in three or more directions.

Also, in the present embodiment, the present invention is applied only to the connecting point between the main line 43B and the bus bar 43FM.

However, the present invention is not limited only to this connecting point, and may also be equally applied, for instance, to a subsequent branch point that is contiguous to the bus bar 43FM and is formed for the parallel feeding.

Furthermore, the present invention may be equally applied if there is a KU band (13.75 GHz to 14.5 GHz) as well as a frequency band (mainly 10 GHz to 80 GHz) in which the triplate feed-type planar antenna can be constituted.

Also, the present invention may be applied if there is an antenna in which the feed line, the main line 43B, and the patch antennas $43A_{1,1}$ to $43Am,n$ including the bus bar 43FM are formed on a circuit board as a pattern.

Figure 3:
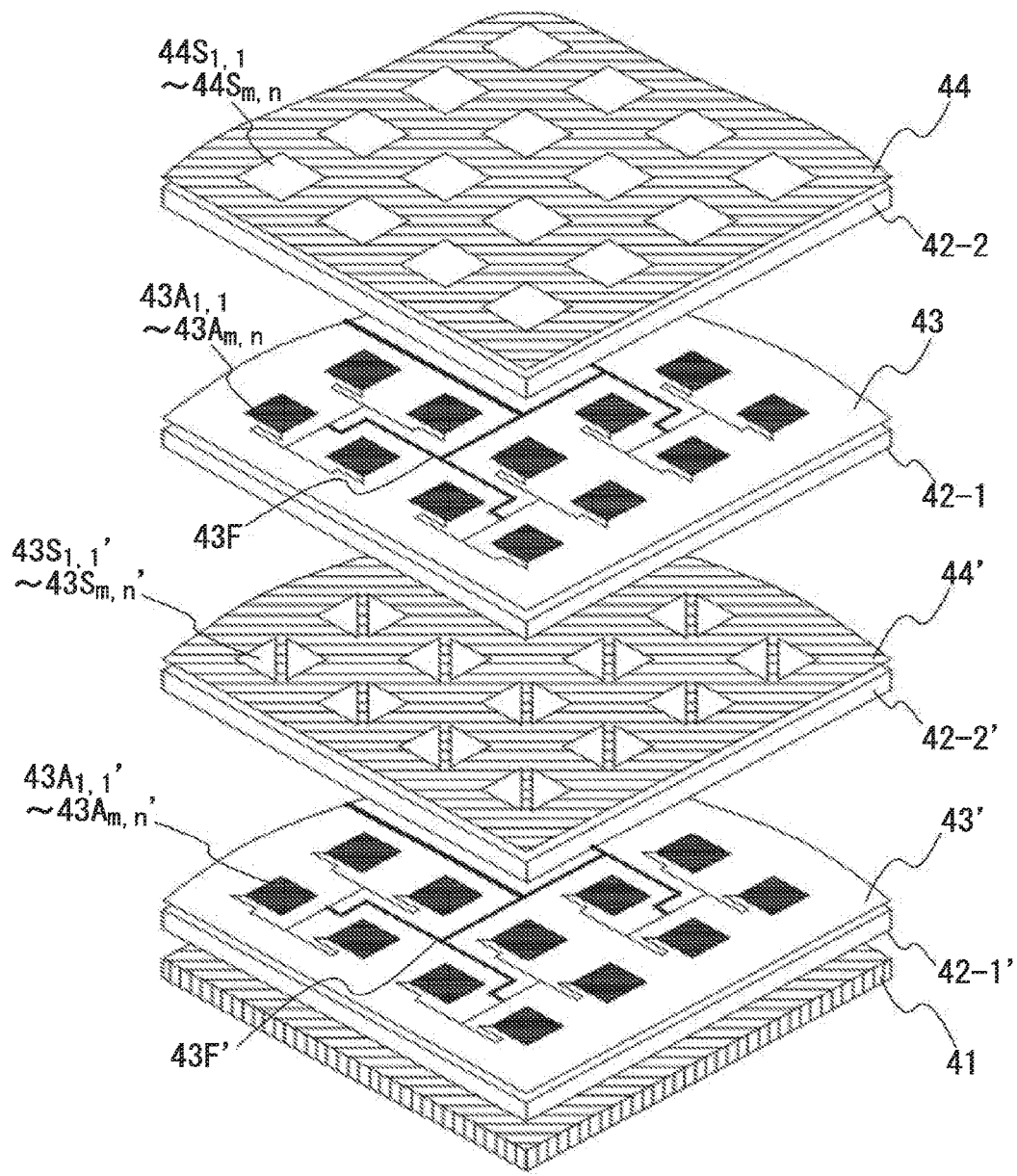
FIG. 3 is a view illustrating an appearance of a triplate feed-type planar antenna in which polarized waves are shared and to which the present invention is applied.

Moreover, the present invention may also be equally applied to a polarized wave-dedicated planar antenna in which a wireless transmission line is formed at an uplink and a downlink by common polarized waves as well as a planar antenna in which the polarized waves are shared and in which a wireless transmission line is formed at these links by mutually orthogonal polarized waves, for example, as illustrated in FIG. 3. In FIG. 3, elements having the same function (including elements having the prime (i.e. ') designation) as those illustrated in FIGS. 1, 2, 4 and 5 are given like signs, and description thereof will be omitted here.

In addition, the present invention is not limited to the aforementioned embodiment. Various embodiments can be constituted within the scope of the present invention, and any improvements may be carried out for all or some of the components.

INDUSTRIAL APPLICABILITY

The present invention can be widely applied to a feed line formed as a triplate line that runs from a waveguide/triplate-line converter coupled to a radio to a plurality of patch antennas in a cluster pattern.

As the feed line according to the present invention is formed as the triplate line, heating and degradation of characteristics caused by the heating are avoided even in the case in which heat radiation efficiency is structurally low and power supplied from the radio via the waveguide/triplate-line converter is large.

Also, in the feed line according to the present invention, by being formed as the triplate line, a temperature and an amount of heat attributed to heating are suppressed within a limit within which no characteristics are degraded even in the case in which the heat radiation efficiency is structurally low and the power supplied from the radio via the waveguide/triplate-line converter is large.

Accordingly, in an antenna system to which the present invention is applied, supply of power to the individual patch antennas is simply realized with high precision in a desired mode, and furthermore, characteristics and reliability are kept high.

REFERENCE SIGNS LIST

41 Ground plane
42 Foam sheet
43 Flexible substrate
43A Patch antenna
43B Main line
43C Waveguide/triplate-line converter
43CF Waveguide flange
43CP Probe
43CR Annular member
43Cr Annular member
43Cs Short plate
$43C_{WC}$ Waveguide
43F Feed line
43FM Bus bar
43T Transformer
44 Slot plate
44S Slot opening

The invention claimed is:

1. A feed line coupled to a radio, which is formed as a triplate line that runs in a cluster pattern from a waveguide/triplate-line converter to a plurality of patch antennas, wherein a width and a length in a section of the triplate line between the waveguide/triplate-line converter and a branch point on the triplate line which is closest to the waveguide/triplate-line converter are set to values at which a loss of the section of the triplate line is suppressed to or below a preset upper limit, and impedance of the section of the triplate line directly matches impedance of the triplate line downstream of the branch point in parallel.

2. The feed line according to claim 1, wherein the feed line is formed as the triplate line that realizes parallel feeding from the waveguide/triplate-line converter to the plurality of patch antennas.

* * * * *